United States Patent
Zare-Hoseini et al.

(10) Patent No.: US 8,730,076 B2
(45) Date of Patent: May 20, 2014

(54) SPUR REDUCTION CIRCUIT

(75) Inventors: Hashem Zare-Hoseini, Cambridge (GB); Shuja Hussain Andrabi, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/561,507

(22) Filed: Jul. 30, 2012

(65) Prior Publication Data

US 2014/0028374 A1  Jan. 30, 2014

(51) Int. Cl.
*H03M 1/20* (2006.01)

(52) U.S. Cl.
USPC .......................................... 341/131; 341/143

(58) Field of Classification Search
USPC ................................................. 341/131, 143
See application file for complete search history.

(56) References Cited

U.S. PATENT DOCUMENTS

| | | | | |
|---|---|---|---|---|
| 4,968,987 A | * | 11/1990 | Naka et al. ..................... | 341/143 |
| 5,012,242 A | * | 4/1991 | Yoshio et al. .................. | 341/131 |
| 5,148,163 A | * | 9/1992 | Frindle .......................... | 341/131 |
| 6,710,729 B1 | * | 3/2004 | Chen .............................. | 341/143 |
| 7,847,714 B2 | * | 12/2010 | Kumamoto et al. ........... | 341/131 |
| 8,154,118 B2 | * | 4/2012 | Kanazawa et al. ............ | 257/724 |
| 2004/0036636 A1 | * | 2/2004 | Mai et al. ....................... | 341/131 |

* cited by examiner

*Primary Examiner* — Khai M Nguyen
(74) *Attorney, Agent, or Firm* — RatnerPrestia

(57) ABSTRACT

A circuit for modulating an input signal including a dither signal generator configured to generate a first dither signal having a maximum amplitude, a deamplifier configured to reduce the amplitude of said input signal so as to generate a deamplified input signal having a maximum amplitude that is comparable to the maximum amplitude of the dither signal, and a summer configured to sum the dither signal with the deamplified input signal.

24 Claims, 13 Drawing Sheets

SPUR REDUCTION CIRCUIT

FIELD OF THE INVENTION

The present invention relates to a circuit for modulating an input signal. The present invention is particularly useful in eliminating spurious tones generated by digital delta-sigma modulators.

BACKGROUND

A Delta-Sigma Modulator (DSM) is a modulator that is arranged to, on receiving an input signal, output a modulated input signal having fewer bits (or a "lower resolution") than the input signal. The term DSM is sometimes used interchangeably with the term Sigma-Delta Modulator (SDM). Hence, although only DSMs are referred to in the following, this term is intended to encompass both SDMs and DSMs.

The DSM is one of the most popular modulators for low to medium bandwidth applications due to its high resolution capability and noise shaping ability. It can be realised in either the analogue and or the digital domain. Analogue DSMs are mainly used for analogue to digital conversions. In contrast, Digital DSMs (DDSMs) are increasingly used in digital to analogue converters e.g. in an audio system, and in fractional-N frequency synthesisers e.g. in a phase locked loop (PLL).

FIG. 1 shows an example of an audio system comprising a DDSM. A digital codec 11 supplies a signal to DDSM 12. DDSM 12 outputs a modulated codec signal to Digital-to-Analogue-Converter (DAC) 13. The output of DAC 13 is buffered in buffer 14 before being filtered by filter 15 and driven by driver 16 through speaker 17. The DDSM 12 shapes the quantization noise to a high frequency region, where it is subsequently filtered out by the following filter 15 and the speaker 17. DDSMs are widely used in the output channel of an audio system in order to modulate a high resolution digital input (10-24 bits) data to low-resolution bit stream (1-5 bits).

FIG. 2 shows an example of a fractional-N synthesiser in a PLL that comprises a DDSM. A phase-frequency detector (PFD) 21 receives a reference signal $f_{ref}$ and a feedback signal $f_{feed}$ and compares $f_{ref}$ with $f_{feed}$. Based on this comparison, the PFD 21 outputs a comparison signal to filter 22, which in turn outputs a filtered comparison signal to voltage controlled oscillator (VCO) 23. VCO 23 subsequently outputs a signal $f_{out}$, which is input to further signal processing circuitry (not shown) and to fractional-N divider 24 in a feedback loop. Fractional-N divider 24 also receives a signal y[n] from DDSM 25. The factional-N divider 24 divides $f_{out}$ by (N+y[n]) and outputs signal $f_{feed}$. Signal $f_{feed}$ is input to PFD 21 and DDSM 25. DDSM receives signal $f_{feed}$ and signal x[n] and outputs signal y[n] to the fractional-N divider 24. Compared to an integer synthesizer, which divides by N instead of by N+y[n], a fractional-N synthesiser allows very narrow channel spacing relative to the output frequency and large bandwidth in the PLL relative to the channel spacing. DDSMs are used to create the fraction value in the feedback divider in order to mitigate the effect of fractional spurs and to decrease the base band fractional noise over those PPLs not having a DDSM.

FIG. 3 shows an example of the structure of a conventional DDSM. A summer 31 subtracts signal Y[n] from signal X[n] and outputs the result to filter 32. Filter 32 outputs signal U[n] to quantizer 33. Quantizer 33 outputs signal Y[n]. Signal Y[n] is passed to further signal processing circuitry (not shown) and to summer 31.

A DDSM is a finite state machine (FSM) and therefore, the number of available states is finite. If the input X[n], x[n] is constant (as is the case of the Fractional-N synthesisers mentioned above in relation to FIG. 2) or very low (such as when, in audio applications, the inputted signal represents silence), the DDSM can exhibit a trajectory that visits each state once before repeating. Therefore, DDSMs are prone to generating cycles that result in the presence of periodic components in the output spectrum.

When the DSM output bit stream Y[n], y[n] becomes cyclical and enters a repetitive pattern as mentioned above, a series of harmonics called "idle tones" or "spurs" are created at the output of the modulator. This reduces the performance of the system.

The presence of spurs in an output signal is disadvantageous in an audio system. For example, if the magnitude of the spurs in the audio range is bigger than the audible human threshold, they can become audible to a user. This may be irritating to a user.

The presence of spurs in an output signal is also disadvantageous in fractional-N synthesizers. The effect of spurs introduced by the DDSM into a PLL can be significant when combined with the effect of the nonlinearity of the phase detector. The spurs can break the transmit mask or desensitize the receiver in a radio system when the PLL is used to generate a carrier frequency.

It is therefore desirable to reduce or eliminate the DSM spurs in both PLL and Audio applications. This can be done by maximising the length of the cyclical repetitive pattern.

There are two classes of techniques for maximizing cycle lengths in DDSMs: "stochastic"; and "deterministic".

The "stochastic" approach uses a dither signal to disrupt the periodic cycles, so increasing the cycle length. A dither signal may be a random sequence of noise. Adding a dither signal to a signal to be modulated introduces noise into the signal to be modulated. This makes it difficult to form periodic patterns, and thus spurs, in the modulated signal. Adding dither results in smoother noise-shaped spectra than in the case where no dither signal is added. An example showing the effect of adding a dither signal to a signal to be modulated is shown in FIGS. 4A and 4B.

In FIG. 4A, there is a sinusoidal signal and a superimposed truncated signal that is a digital representation of the sinusoidal signal. The truncated signal comprises the same quantization errors every period and so the cycle length is the period. Repeating the quantization error every period introduces spurs into the system.

In contrast, in FIG. 4B there is the same sinusoidal signal and a superimposed truncated signal formed from a digital representation of the sinusoidal signal and an additional dither signal. As the addition of the dither signal randomly introduces noise into the truncated signal, the truncated signal does not comprise the same quantization errors every period. Thus the cycle length in FIG. 4B is longer than a period and hence longer than the cycle length shown in FIG. 4A. Therefore, there are fewer spurs in this system than in the example shown in FIG. 4A.

The higher the dither amplitude, the more successfully idle-tones are removed. In order to remove the spurs completely, the power of the dither signal should be comparable with the power of the input signal to be modulated. However, the maximum power of the dither signal is limited by the maximum noise allowed in the circuit by the intended application (the noise specification of the circuit). Thus, for a given specification, spurs cannot be completely eliminated.

The "deterministic" approach uses an adapted modulator that is arranged to be unstable such that any repetitive pattern tends to be broken up. This can be done by configuring the filter 32 in the DDSM (see FIG. 3) such that the noise shaping zeros of the filter 32 are moved outside the unit circle in the z-domain. Deterministic systems are extremely sensitive to initial conditions and the speed in which they disrupt the cycle length is determined by how unstable the filter 32 is. Even though this technique increases the output noise, it does not completely eliminate tonality and repetitive patterns and hence spurs. In practice, deterministic approaches are avoided because the reliability of the approach is very sensitive to the initial conditions.

Some other techniques may also be used to increase the cycle length. For example, seeding, offsetting the input by 1-LSB for an increased word length and using prime modulus quantizers.

Among all the techniques, dithering has proved to be the most effective and simple way of suppressing the tonality of the DDSMs. However, in practical implementations, the noise specification of the circuits in which dithering is implemented means that spurs cannot be completely eliminated.

There is thus a need for a system that addresses these problems.

SUMMARY

According to a first aspect of the present invention, there is provided a circuit for modulating an input signal comprising; a dither signal generator configured to generate a first dither signal having a maximum amplitude; a deamplifier configured to reduce the amplitude of said input signal so as to generate a deamplified input signal having a maximum amplitude that is comparable to the maximum amplitude of the dither signal; and a summer configured to sum the dither signal with the deamplified input signal.

The summer may be configured to output a summed signal and the circuit may further comprise a first modulator configured to modulate the summed signal. The first modulator may be configured to output a modulated signal, the modulated signal comprising a dither component. The circuit may further comprise a canceller configured to at least partially cancel the dither component from the first modulated signal to form a cancelled signal. The circuit may comprise an amplifier configured to amplify the cancelled signal.

The dither signal generator may be further configured to generate a second dither signal, the circuit further comprising another summer configured to subtract the second dither signal from the divided input signal. In this case, the circuit may comprise a second modulator configured to receive and modulate a summed signal output by the other summer and to output a modulated signal in dependence thereon. The first and second dither signals may be the same signal.

The dither signal generator may be further configured to generate a second dither signal, the circuit further comprising another summer configured to add the second dither signal to the divided input signal. In this case, the circuit may further comprise a second modulator configured to receive and modulate a summed signal output by the other summer and to output a second modulated signal in dependence thereon.

The first dither signal may have the form r[n] and the second dither signal has the form −r[n].

The canceller and the amplifier may be implemented by an adder configured to add the first and second modulated signals together The first and second modulators may be digital modulators.
The first and second modulators may be delta-sigma modulators.

The dither signal generator may comprise a pseudorandom number generator for generating the dither signals.

The circuit may further comprise an offset generator configured to form the input signal by adding an offset to an initial signal.

The circuit may further comprise an offset-summer configured to effectively subtract the offset from the first modulated signal.

The first dither signal may have an average amplitude of zero.

The deamplifier gain may be 1.

The circuit may have a maximum noise level associated therewith and the dither signal generator may be configured to generate the first dither signal to have a maximum amplitude that is dependent on the maximum noise level.

The maximum amplitude of the dither signal may be at least 80% of the maximum amplitude of the deamplified input signal.

The maximum amplitude of the dither signal may be at least 90% of the maximum amplitude of the deamplified input signal.

The maximum amplitude of the dither signal may be the same as the maximum amplitude of the deamplified input signal.

According to a second aspect of the present invention, there is provided an audio system comprising a circuit according to the first aspect of the present invention.

According to a third aspect of the present invention, there is provided a phase locked loop comprising a circuit according to the first aspect of the present invention.

According to a fourth aspect of the present invention, there is provided a method for modulating an input signal in a circuit configured to receive an input signal to be modulated, comprising the steps of; generating a dither signal having a maximum amplitude; reducing the amplitude of said input signal so as to generate a deamplified input signal having a maximum amplitude that is comparable to the maximum amplitude of the dither signal; and summing the dither signal with the deamplified input.

According to a fifth aspect of the present invention, there is provided a circuit for applying a dither signal comprising: a first signal path comprising: a first input configured to receive an input signal; a first summer configured to produce a first summed signal by summing a dither signal with the input signal; and a first modulator configured to receive and modulate the first summed signal so as to output a first modulated signal; a second signal path comprising: a second input configured to receive the input signal; a second summer configured to produce a second summed signal by subtracting the dither signal from the input signal; and a second modulator configured to receive and modulate the second summed signal so as to output a second modulated signal; the circuit further comprising: a canceller configured to sum the first and second modulated signals.

DESCRIPTION

Figure 1:
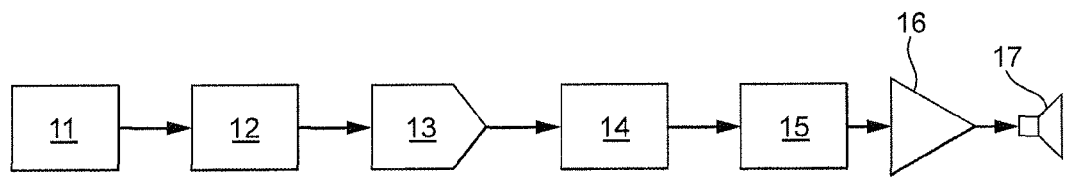
FIG. 1 illustrates a DDSM in an audio circuit.
Figure 2:
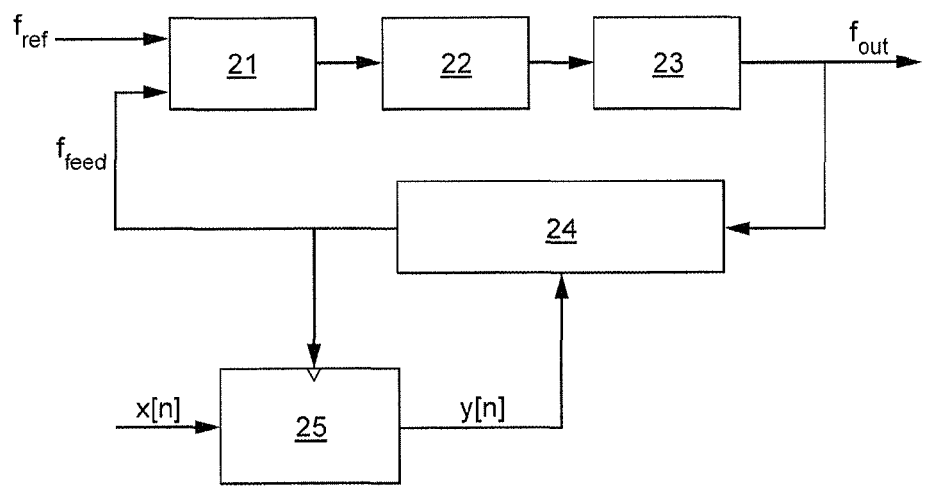
FIG. 2 illustrates a DDSM in a phase-locked loop.
Figure 3:
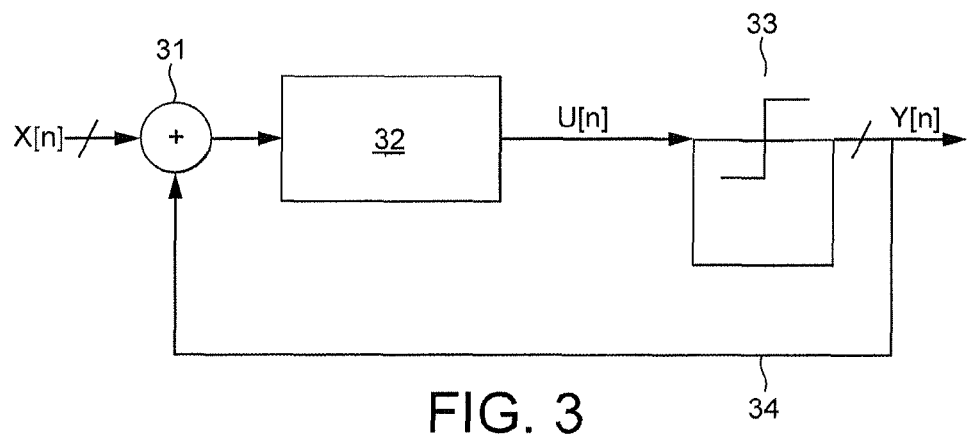
FIG. 3 illustrates a conventional DDSM structure.

The present invention relates to a circuit for modulating an input signal. In one embodiment, the circuit comprises a dither signal generator, a deamplifier and a summer. The dither signal generator is configured to generate a dither signal that has a maximum amplitude. The deamplifier is configured to receive an input signal and reduce the amplitude of the input signal to generate a deamplified input signal. The deamplified input signal has a maximum amplitude that is comparable to the maximum amplitude of the dither signal. The summer receives the dither signal and the deamplified input signal and sums them together. The summer may sum the dither signal with the deamplified input signal by adding them together. Alternatively, the summer may sum the dither signal with the deamplified signal by subtracting one signal from the other signal.

By configuring the circuit in this way, a signal is generated having a dither component that is comparable to the deamplified input signal component. This generated signal has a relatively high amount of dither, given the relative amplitudes of the dither and the deamplified input signal. This arrangement increases the cycle length and hence can be used to give a spur reduced output compared to conventional circuits.

After summing the dither signal and deamplified input signal together, the summed signal is modulated in a modulator. The modulated signal comprises both dither components and deamplified input signal components. A canceller 57 is configured to receive the modulated signal and to reduce or eliminate dither components in the modulated signal Y[n]. This signal may then be amplified so that the resulting signal has a desired amplitude.

Preferably, the dither signal has a maximum amplitude of at least 80% of the maximum amplitude of the deamplified input signal. More preferably, the dither signal has a maximum amplitude of at least 90% of the maximum amplitude of the deamplified input signal. In a preferred implementation, the dither signal and the deamplified input signal have the same maximum amplitude.

As mentioned below, the amplitude of the deamplified input signal relative to the dither signal can be selected in order to completely remove spurs.

In a conventional modulator, there are at least two factors that limit the maximum amplitude of the dither signal: the maximum noise specification of the circuit (aka "noise level") and the maximum input dynamic range of the modulator.

The maximum noise specification of a circuit is the maximum amount of noise that circuit is allowed to add to a signal passing through it. The maximum input dynamic range of the modulator is the ratio between the smallest and largest values of a signal that can be received by the modulator.

As mentioned in the background section, in conventional modulators the primary limiting factor in selecting a maximum amplitude for the dither signal is the maximum noise specification of a circuit. However, in the present case, it is more likely that the input dynamic range of the modulator will affect the selection of maximum amplitude of the dither signal than the maximum noise specification of a circuit.

If the maximum amplitude of the dither signal r[n] is dependent on the maximum noise level associated with the circuit, the amplitude of dither signal r[n] may vary up to a maximum level allowed by the noise requirements of the circuit. Assuming that the other components in the circuit are configured to introduce a combined noise N that is less than the maximum noise level M associated with the circuit, the maximum dither amplitude is set so the floor noise F introduced by the dither signal fulfils the relationship:

$$N+F \leq M$$

In other words, given the noise N introduced into the circuit by the components of the circuit not relating to the dither signal, the floor noise F introduced by the dither signal does not cause the total noise of the circuit to exceed the maximum noise level M associated therewith.

The maximum noise level is dependent on the intended use of the circuit. For example, if the circuit is to be integrated into a system that is intolerant of noise e.g. a high sensitivity receiver, the maximum noise level associated with the circuit may be likely to be lower than if the circuit is integrated into a system that is more tolerant of noise e.g. a low sensitivity receiver. The maximum noise level of the circuit may also vary depending on whether the circuit is arranged to modulate a DC signal or a non-DC signal.

If the maximum amplitude of the dither signal r[n] is dependent on the input dynamic range of the modulator, the amplitude of dither signal r[n] may vary up to a maximum level allowed by the input dynamic range of the modulator. Assuming that the modulator has a maximum input of $I_{max}$ and a minimum input of $I_{min}$ and the deamplified input signal has a maximum amplitude of $A_{inmax}$ and a minimum amplitude of $A_{inmin}$, then the amplitude $A_{dith}$ of the dither signal r[n] should be set such that the maximum and minimum amplitudes ($A_{dithmax}$ and $A_{dithmax}$ respectively) of the dither signal fulfils the relationships:

$$I_{min} \leq A_{dithmin} + A_{inmin}$$

$$A_{dithmax} + A_{inmax} \leq I_{max}$$

In other words, the amplitude of the signal resulting from the summation of the dither signal and the deamplified input signal lies within the amplitude range accepted by the modulator. This enables the modulator to avoid clipping the signal to be modulated.

The maximum noise level and/or the maximum input dynamic range of the modulator may be preprogrammed into a memory to which the circuit has access. Alternatively, the maximum noise level and/or the maximum input dynamic range of the modulator may be determined dynamically in a processor that has access to, and the ability to reconfigure the circuit in order to take account of the determined quantity. With this aim, the circuit may comprise a re-writeable memory.

In most cases involving the present invention, it is expected that the primary limiting factor in selecting the maximum amplitude of the dither signal will be the maximum input dynamic range of the modulator.

Figure 6:
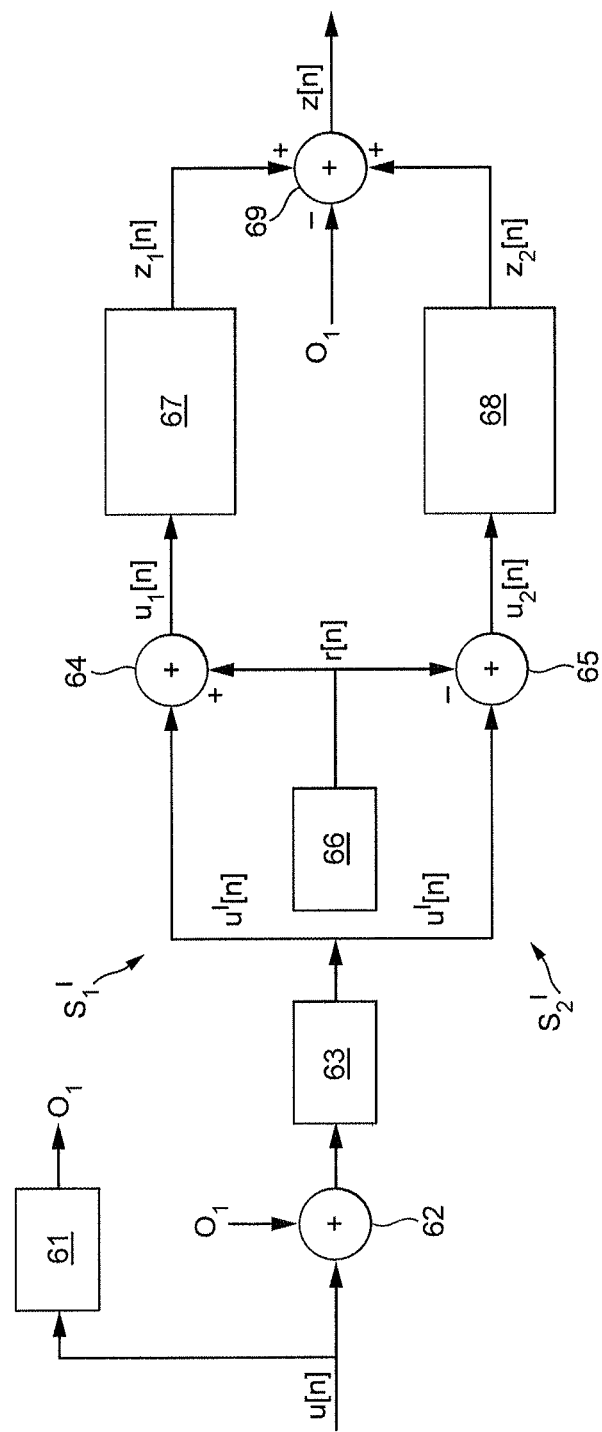
FIG. 6 illustrates another preferred embodiment of the present invention.

For applications employing a DDSM arranged to receive a DC input, such as fractional-N synthesizers, the optimum level of dither is half the input dynamic-range of a modulator. In order to be sure that the modulator is not overloaded, an offset can be added to the input. FIG. 6 shows such an arrangement and is discussed as a preferred embodiment below. Assuming that the initial input signal is between 0 and 1, an offset of 0 or 1 is added to the input signal prior to deamplification and summing with the dither signal. Subsequently, the offset is subtracted from the signal output from the modulator. This ensures that with a high-level of dither (e.g. $-\frac{1}{4}$ to $+\frac{1}{4}$) the input of each modulator is within the modulators' operating range of 0 to 1.

For applications employing a DDSM where the input is not DC and has a high dynamic range (e.g. audio systems), spurs appear when the input gets very small ("silence time"). Therefore the optimum level of dither is lower than the input dynamic range of the DDSM.

The system may comprise multiple modulators. If the system does comprise multiple modulators, it may be beneficial to make the modulators purely digital. This is so that the Signal Transfer Functions (STFs) of the modulators can be made identical. Therefore, the dither will pass through the same STF in each modulator and dither components in the modulated output signals can be cancelled by adding the modulated signals together e.g. at summers 57, 69 (see FIGS. 5 and 6). Also, if the system is digital, there is no aliasing or fold-back of the random dither. Digital implementation is preferred over analogue implementation as two modulators cannot be matched perfectly in an analogue system as easily or as well as they can in a digital system. Also, in an analogue implementation DSM aliasing will prevent good cancellation for dither at the output. Therefore, digital modulators are preferred.

Preferably the system comprises two modulators. If the modulators are DDSMs, this system does not introduce a high cost considering the benefit of spur removal. One of the big advantages is that the proposed system is very compact in terms of area consumption on a chip. Compared to known circuits for reducing or eliminating spurs, the small area overhead introduced by the proposed system over the conventional circuit shown in FIG. 4 is much less.

Figure 4A:
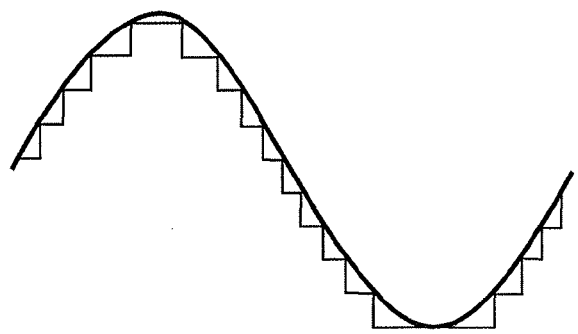
FIGS. 4A and 4B illustrate the effect of adding a dither signal to a digital representation of a signal.
Figure 4B:
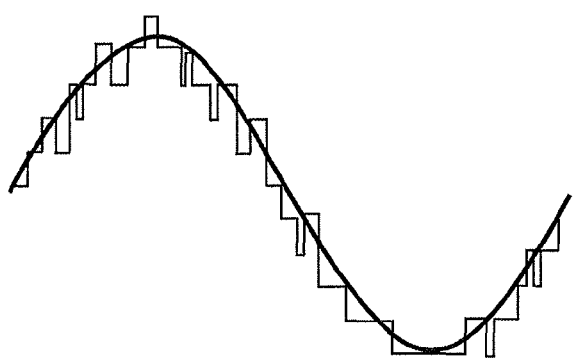

Also, the proposed system does not impose a high cost in terms of an increased power consumption over the conventional circuit shown in FIG. 4. In the case of a fractional-N PLL, the DDSM works with the reference frequency, which is typically low-frequency compared to its output. In an audio-system, again the DDSM works with a moderately low-frequency clock. Therefore in terms of power consumption, the proposed system does not impose a high cost.

The following discusses preferred embodiments of the present invention.

Figure 5:
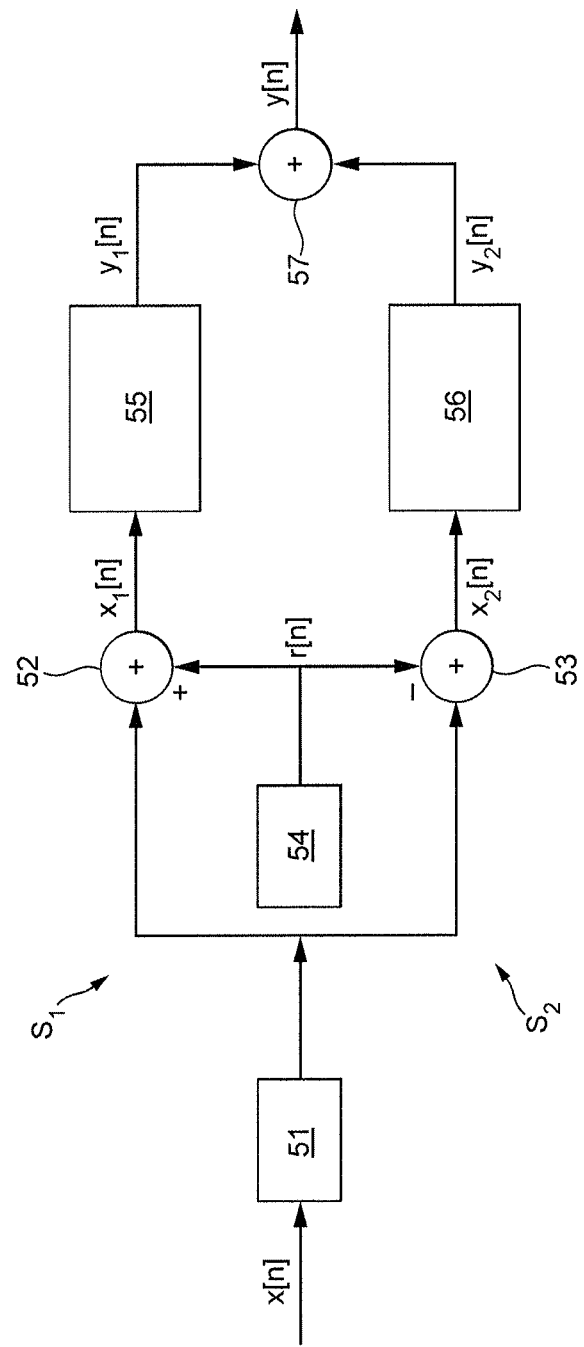
FIG. 5 illustrates a preferred embodiment of the present invention.

FIG. 5 illustrates a preferred embodiment of the present invention. In FIG. 5, deamplifier 51 receives a signal $x[n]$ and outputs a signal $x'[n]$ to signal paths $S_1$ and $S_2$. In signal path $S_1$, $x'[n]$ is passed to summer 52, which sums $x'[n]$ with dither signal $r[n]$ to produce summed signal $x_1[n]$. Dither signal $r[n]$ is output from dither signal generator 54. Summed signal $x_1[n]$ is passed to DDSM 55, which outputs signal $y_1[n]$. In signal path $S_2$, $x'[n]$ is passed to summer 53, which subtracts dither signal $r[n]$ from $x'[n]$ to produce summed signal $x_2[n]$. Summed signal $x_2[n]$ is passed to DDSM 55, which outputs signal $y_2[n]$. Signals $y_1[n]$ and $y_2[n]$ are summed in summer 57 to produce signal $y[n]$. Signal $y[n]$ is passed to further processing circuitry (not shown).

The embodiment shown in FIG. 5 operates as follows: on receiving an input signal $x[n]$, deamplifier 51 is arranged to reduce the amplitude of $x[n]$ by half to produce signal $x'[n]$. Signal $x'[n]$ is passed along to signal paths $S_1$ and $S_2$. In signal path $S_1$, $x'[n]$ is added to a dither signal $r[n]$ in summer 52 to produce signal $x_1[n]$, where;

$$x_1[n]=x'[n]+r[n]$$

$x_1[n]=x'[n]+r[n]x_1[n]$ is passed to DDSM 55, which delta-sigma modulates $x_1[n]$ to produce signal $y_1[n]$.

In signal path $S_2$, dither signal $r[n]$ is subtracted from $x'[n]$ in summer 53 to produce signal $x_2[n]$, where;

$$x_2[n]=x'[n]-r[n]$$

$x_2[n]$ is passed to DDSM 56, which delta-sigma modulates $x_2[n]$ to produce signal $y_2[n]$. Signals $y_1[n]$ and $y_2[n]$ are added together in summer 57 to produce signal $y[n]$. $y[n]$. Summer 57 has the effects of mitigating the effects of components in $y[n]$ attributable to dither signal $r[n]$ and of ensuring that the amplitude of $y[n]$ is comparable to that of $x[n]$.

As described above, the amplitude of dither signal $r[n]$ may vary up to a maximum level allowed by the maximum dynamic range of the modulators.

FIG. 6 shows another preferred embodiment of the present invention. As illustrated therein, input signal $u[n]$ is input to offset generator 61 and to summer 62. Offset generator 61 outputs offset $o_1$. Offset $o_1$ is input to summer 62. Summer 62 outputs a summed signal to deamplifier 63, which in turn outputs a signal $u'[n]$ to signal paths $S_1'$ and $S_2'$. In signal path $S_1'$, $u'[n]$ is passed to summer 64, which sums $u'[n]$ with dither signal $r[n]$ to produce signal $u_1[n]$. Dither signal $r[n]$ is output from dither signal generator 66. Summed signal $u_1[n]$ is passed to DDSM 67, which outputs signal $z_1[n]$. In signal path $S_2'$, $u'[n]$ is passed to summer 65, which subtracts dither signal $r[n]$ from $u'[n]$ to produce signal $u_2[n]$. Signal $u_2[n]$ is passed to DDSM 68, which outputs signal $z_2[n]$. Signals $z_1[n]$ and $z_2[n]$ are summed in summer 69 with offset $o_1$ to produce signal $z[n]$. Signal $z[n]$ is passed to further processing circuitry (not shown).

The operation of the circuit shown in FIG. 6 is substantially the same as shown in FIG. 5 and discussed above. However, in contrast to FIG. 5, prior to being deamplified in deamplifier 63, the input signal $u[n]$ firstly has an offset $o_1$ added in summer 62. The offset $o_1$ is generated in offset generator 61, which receives input signal $u[n]$ and outputs offset $o_1$. Offset $o_1$ is determined in dependence on the input signal $u[n]$. In a preferred embodiment, offset $o_1$ is determined in dependence on the maximum amplitude of the input signal $u[n]$. Offset $o_1$ could have either a positive or a negative value.

Once the offset $o_1$ has been added to the input signal $u[n]$ in summer 62, summer 62 passes the modified signal to deamplifier 63. Deamplifier 63 is arranged to reduce the amplitude of $u[n]$ by half to produce signal $u'[n]$. Signal $u'[n]$ is passed along to signal paths $S_1'$ and $S_2'$. In signal path $S_1'$, $u'[n]$ is added to a dither signal $r[n]$ in summer 64 to produce signal $u_1[n]$, where;

$$u_1[n]=u'[n]+r[n]$$

$u_1[n]$ is passed to DDSM 67, which delta-sigma modulates $u_1[n]$ to produce signal $z_1[n]$.

In signal path $S_2'$, dither signal $r[n]$ is subtracted from $u'[n]$ in summer 65 to produce signal $u_2[n]$, where;

$$u_2[n]=u'[n]-r[n]$$

$u_2[n]$ is passed to DDSM 68, which delta-sigma modulates $u_2[n]$ to produce signal $z_2[n]$. Signals $z_1[n]$ and $z_2[n]$ are added together in summer 69 to produce signal $z[n]$. $z[n]$. Summer 69 has the effect of mitigating the effects of components in $z[n]$ attributable to dither signal $r[n]$ and of ensuring that the amplitude of $z[n]$ is comparable to that of $u[n]$.

Summer 69 is also configured to receive the offset $o_1$ and to either add or subtract the offset $o_1$ to $z_1[n]$ and $z_2[n]$ when producing $z[n]$. In essence, summer 69 performs the inverse operation with respect to offset $o_1$ than at summer 62. This means that if the offset $o_1$ is added $u[n]$ at summer 62, it is subtracted at summer 69. Conversely, if the offset $o_1$ is subtracted from u[n] at summer 62, it is added back into the signal at summer 69. In the present example, the first scenario applies. By adding or subtracting the offset $o_1$ to $z_1[n]$ and $z_2[n]$ when producing z[n], the circuit is configured to effectively remove the offset $o_1$ from the $z_1[n]$. This is regardless of whether the offset is removed from $z_1[n]$, $z_2[n]$ or from the summed signal z[n].

As described above, the amplitude of dither signal r[n] may vary up to a maximum level allowed by the maximum input dynamic range of the modulators.

FIGS. 7 to 10 display comparative results for the proposed system and the conventional system for mitigating spurs. Each of these results represents an average over 10 simulations. Averaging the results in this way helps to identify any spurs buried below the quantization noise level.

Figure 7:
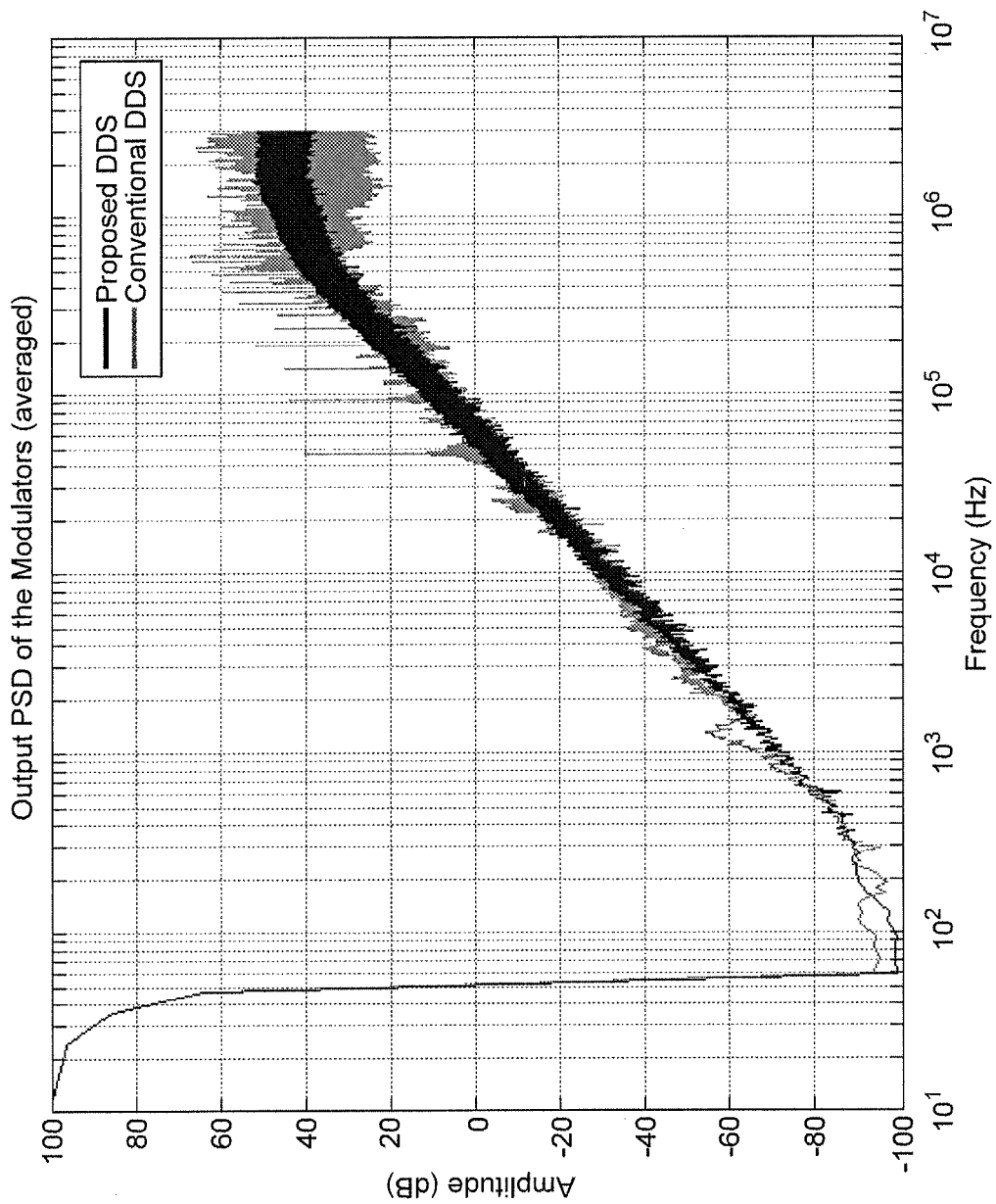
FIG. 7 illustrates the difference in the output between a taught DDSM and a conventional DDSM.

In addition, in each of FIGS. 7 to 9 the conventional modulator has been modelled to include a small amount of dither. This makes the comparison realistic to practical implementations.

FIG. 7 illustrates the output power spectral density (PSD) of the proposed DDSM and the conventional DDSM. The DC input was $\frac{1}{2}-(\frac{1}{2})^7$, which is approximately:

$$0.5-0.0078=0.4922$$

The DC input was chosen to be close to 0.5 in order to see the effect of spur modulation at Nyquist frequencies. The graph in FIG. 7 clearly shows that there is increased spur reduction in the new proposed system compared to the conventional system.

Figure 9A:
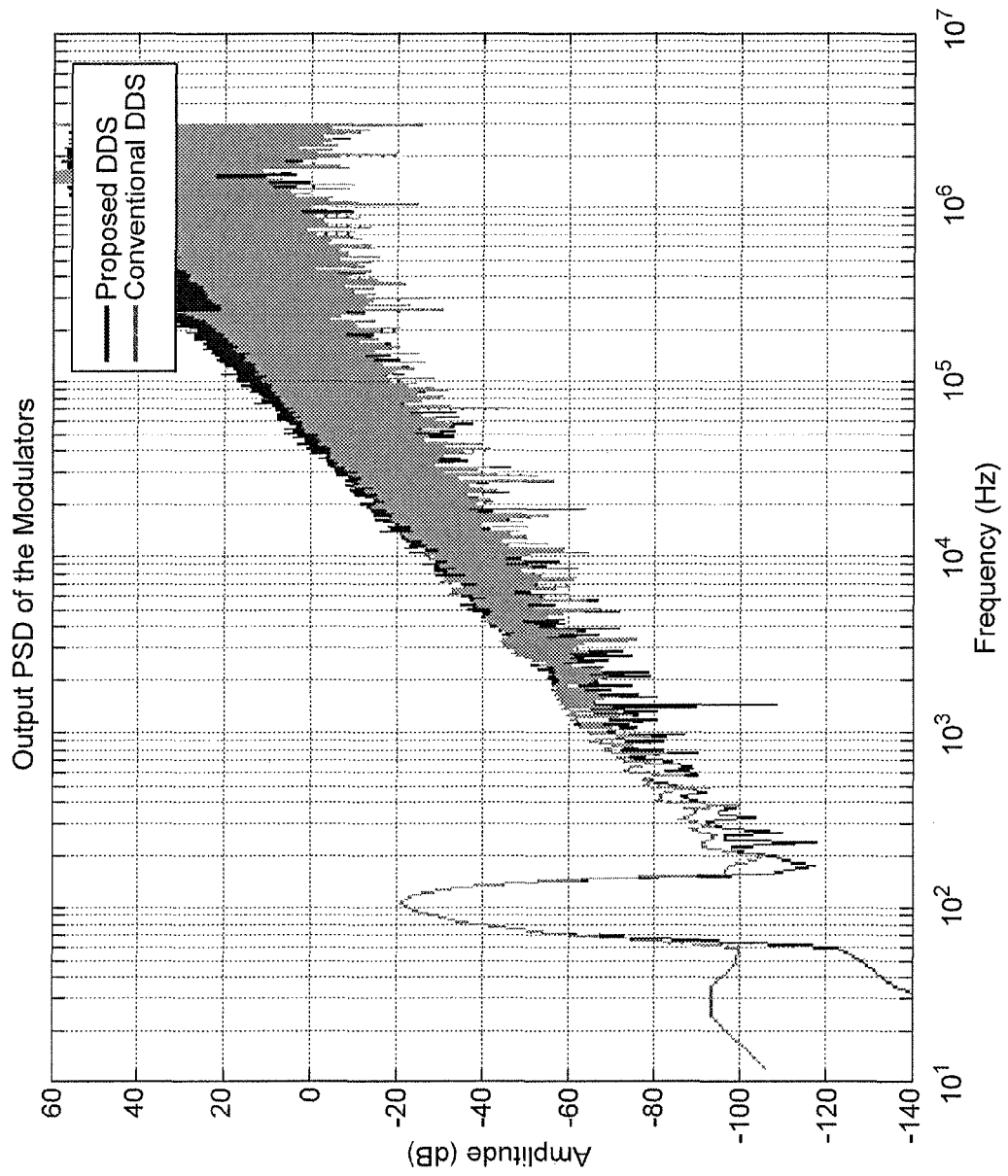
FIGS. 9A to 9C also compare various output signals of a taught DDSM with those corresponding outputs of a conventional DDSM.
Figure 10A:
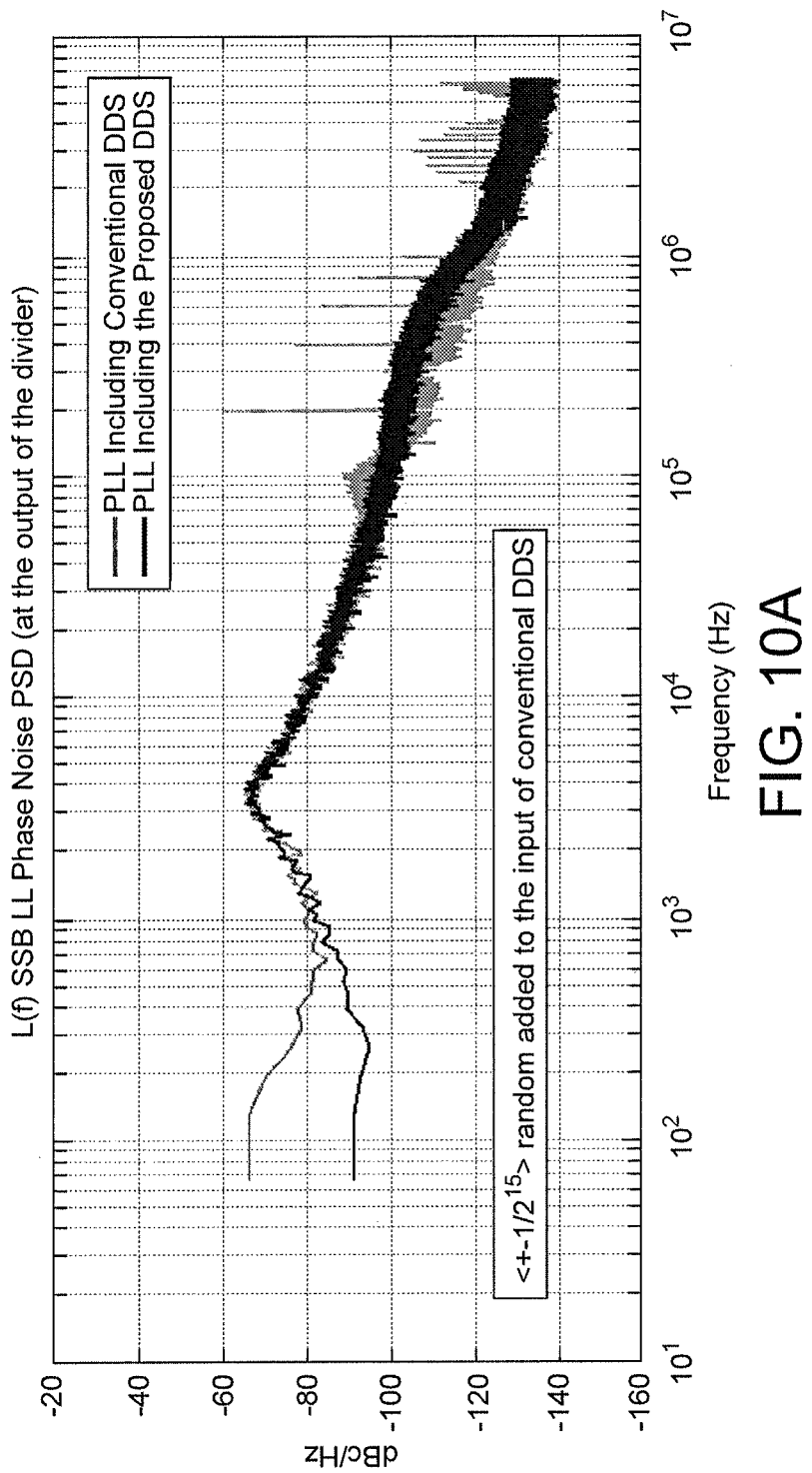
FIGS. 10A and 10B compare the output of a PLL comprising a taught DDSM with the output of a PLL comprising a conventional DDSM.
Figure 10B:
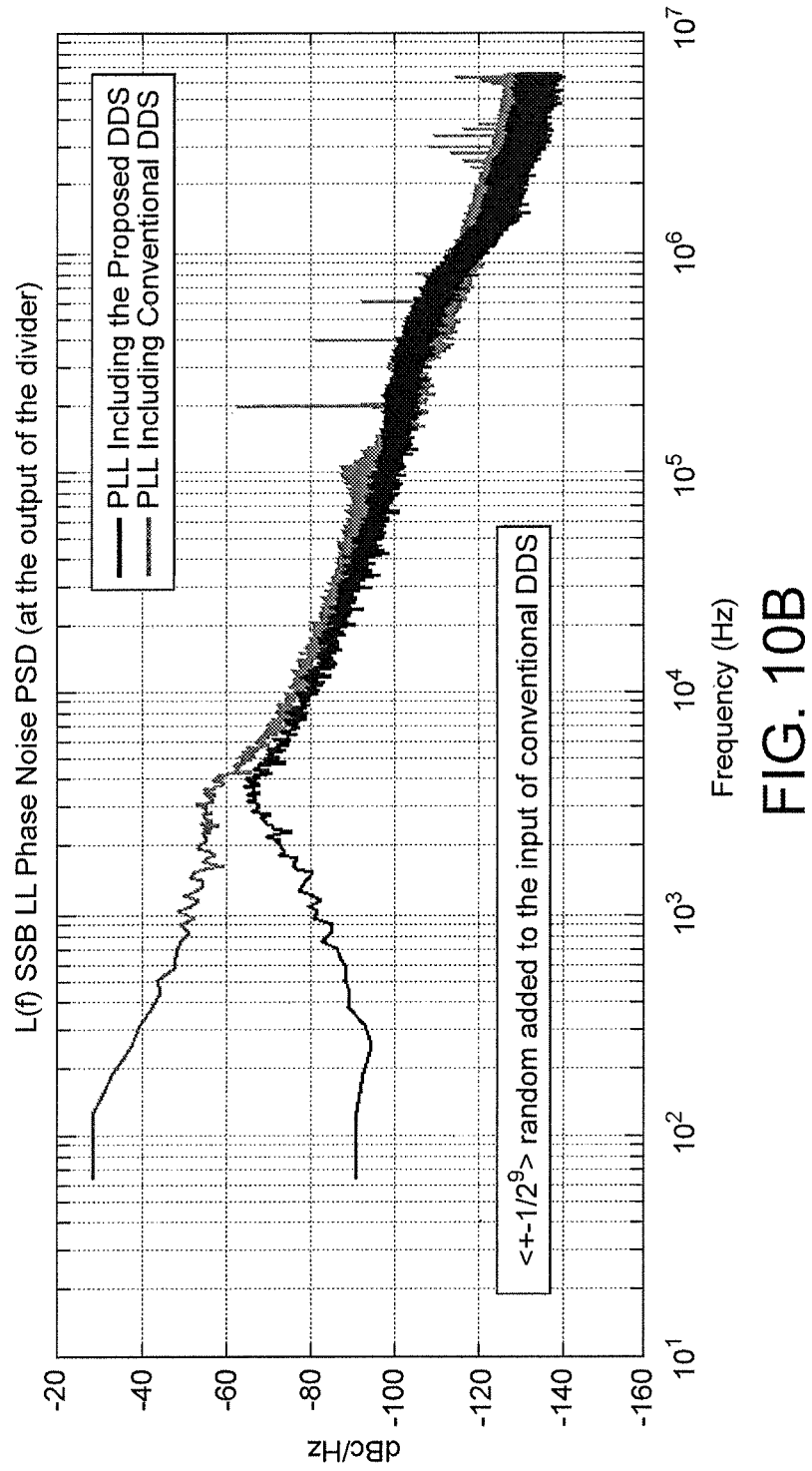

FIGS. 10A and 10B demonstrate the effect of DDDSM spurs at the output of a fractional-N PLL. FIG. 9A shows the output phase noise of the PLL for both the conventional and proposed systems. In the conventional system, a small dither of $+/-((0.5)^{17})$ has been added to the input in order to alleviate its tonality. The output phase noise graph shows that the conventional system has a high tonality (a large amount of spurs) and a low-frequency phase noise that is increased due to the small dither at the input of the DDSM in the conventional system.

In contrast, the proposed system displays a spur-free spectrum and no low-frequency phase noise is present. The total phase noise of the proposed system, which is in the range of 200 kHz to 1 MHz, is a little bit higher than the conventional system. This is because the proposed technique has two sources of quantization noise instead of one (as is the case in the conventional system. Also, most of the power of the conventional system in this frequency range is located in the high frequency spurs. This also adds to the total phase noise of the proposed system relative to the conventional system.

By increasing the amount of dither in the conventional system, the amount of spurs may be reduced. This is shown in FIG. 10B, in which the dither has been increased to $+/-((0.5)^9)$. Clearly, the level of spurs in the conventional case has decreased relative to the conventional system in FIG. 10A. However, the spurs have not completely gone and the phase noise, especially at the lower frequencies, has increased compared to the conventional system in FIG. 10A.

Figure 8A:
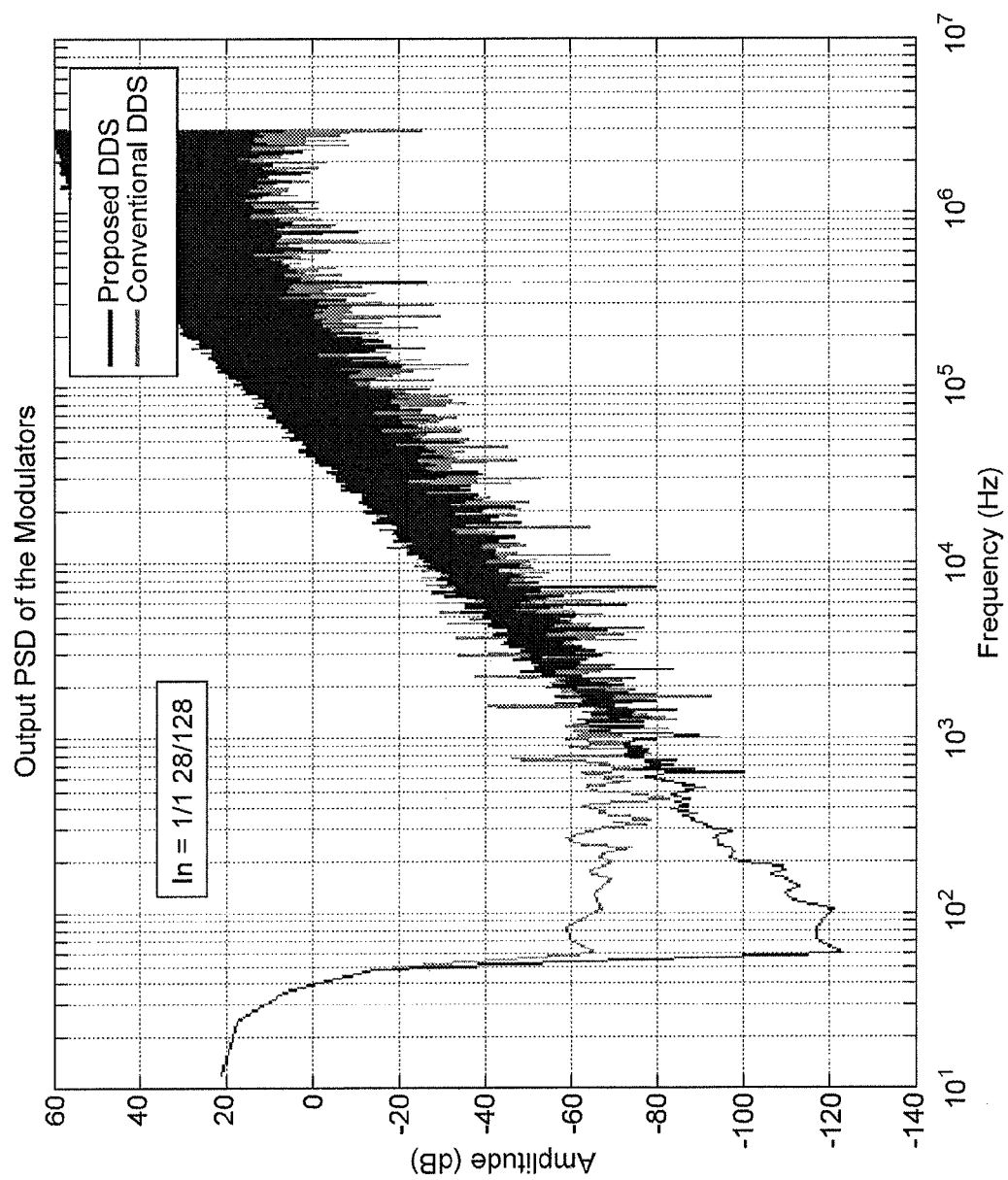
FIGS. 8A to 8C compare various output signals of a taught DDSM with those corresponding outputs of a conventional DDSM.
Figure 8B:
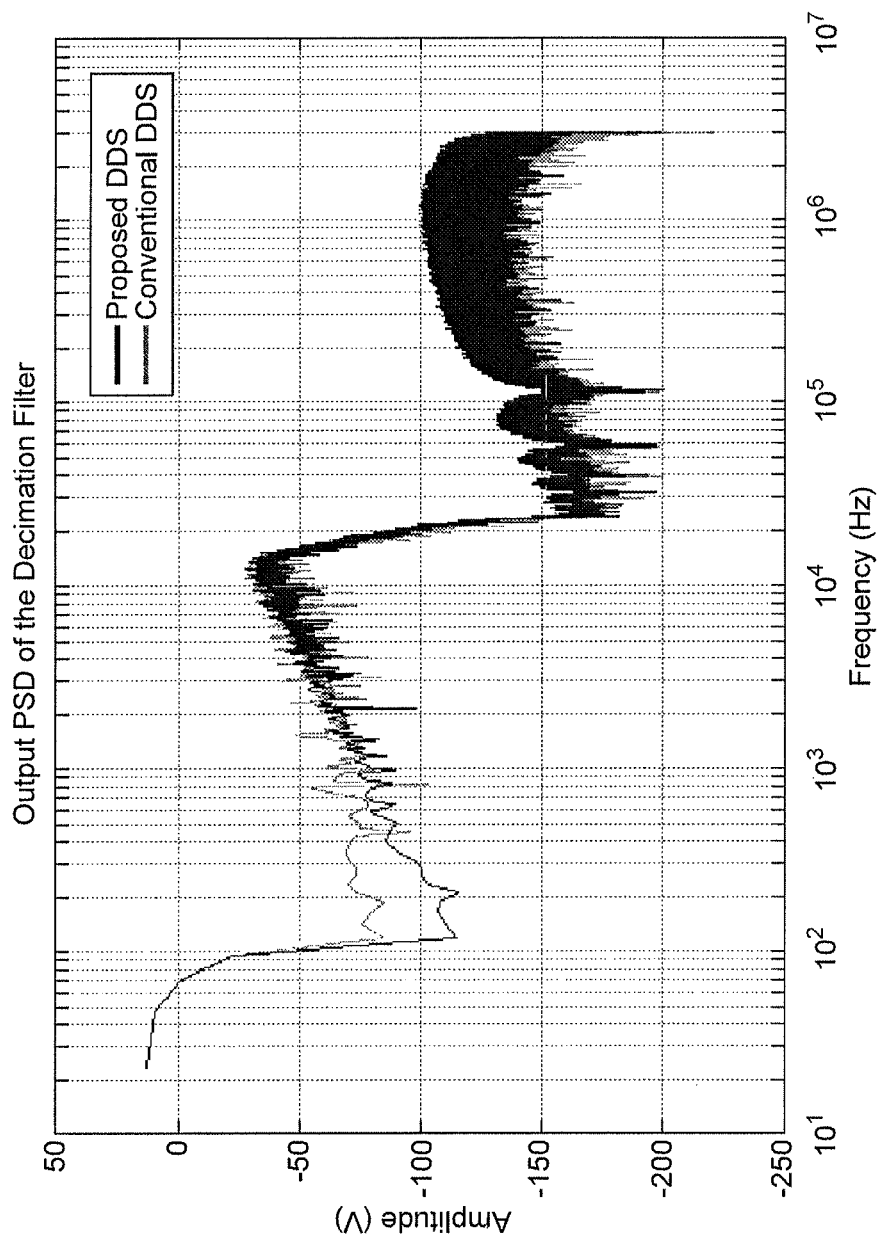
Figure 8C:
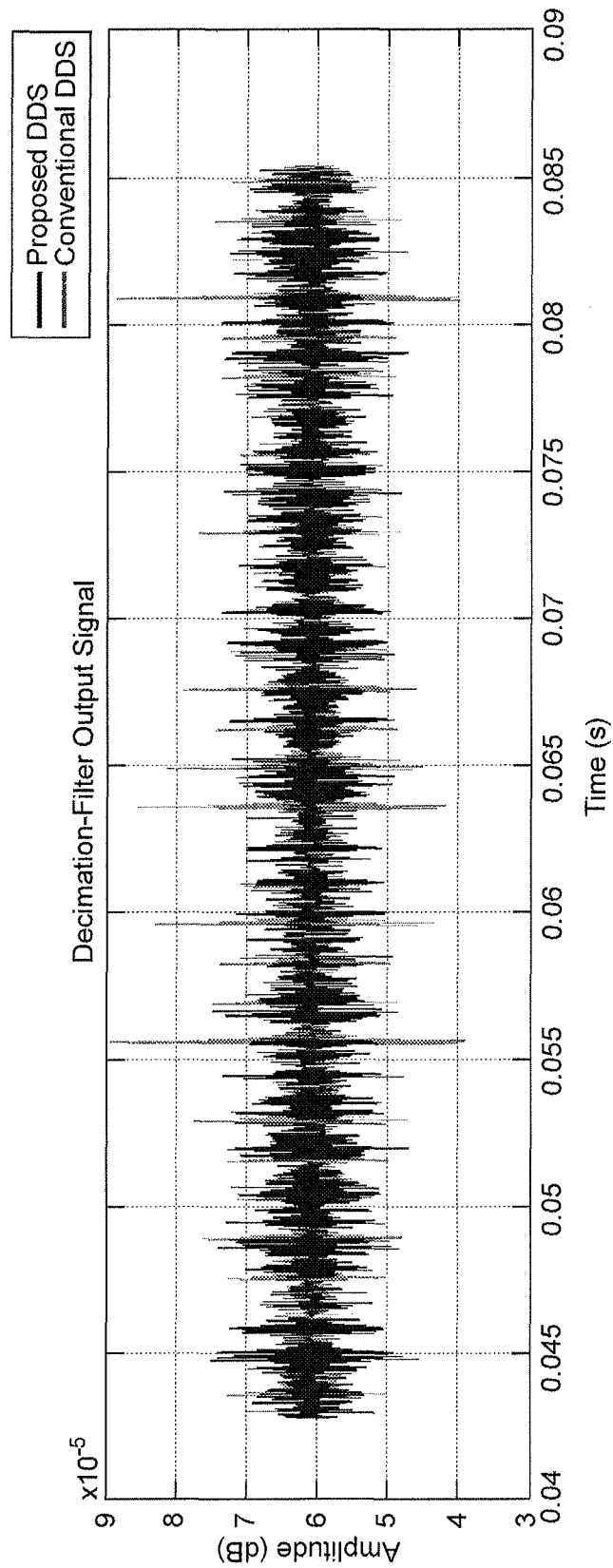

The output PSD of the modulators (conventional and proposed) for a low-level input of $(0.5)^{17}$ is shown in FIG. 8A. This output is subsequently fed to a sharp decimation filter. This allows for digitised data to be seen after the whole conversion (as shown in FIG. 8B). The transient output of the conventional and the proposed systems is shown in FIG. 8C. In all of these figures, the proposed system shows no spurs in either the frequency or the time domain. In contrast, the conventional system does display spurs in both the time and frequency domains. Thus the proposed system is advantageous over those conventionally employed.

Figure 9B:
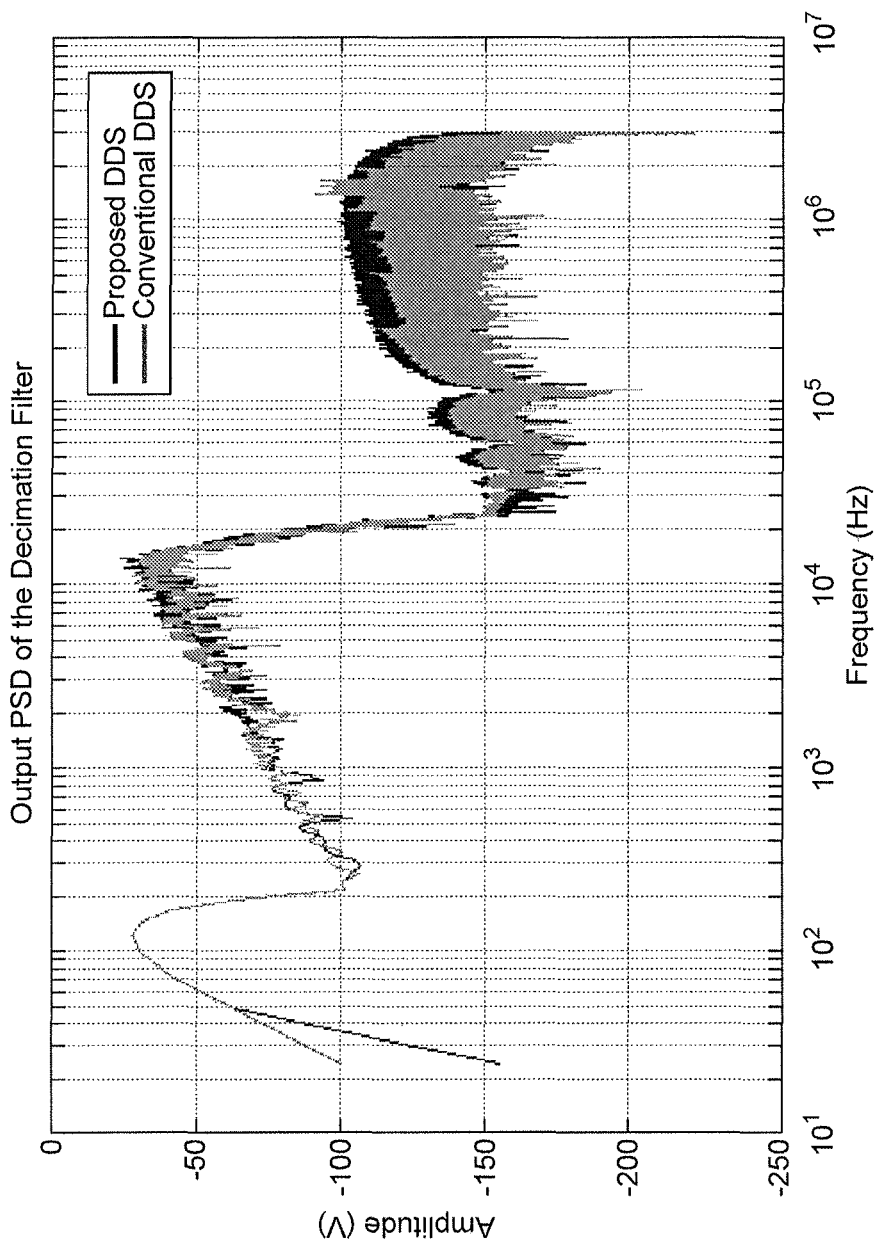
Figure 9C:
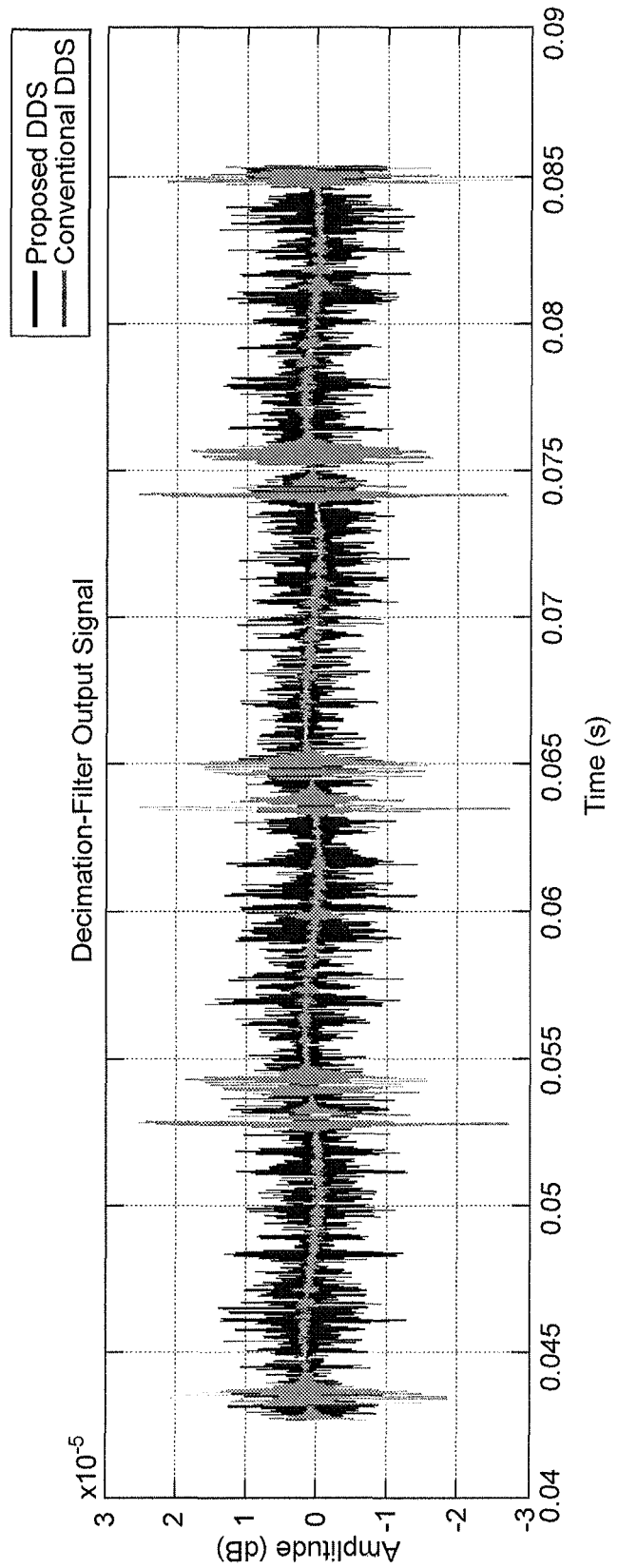

In order to be sure that the proposed system does not conceal spurs to a region below the quantization noise, the input of $(0.5)^{17}$ referred to in relation to FIG. 8 was replaced with a small sinusoidal signal having a maximum amplitude of 1 μV. This particular system is particularly important for an audio system where no audible spurs should be heard. These results are shown in FIGS. 9A to 9C. The output PSD of the modulators (conventional and proposed) is shown in FIG. 9A. This output is subsequently fed to a sharp decimation filter. This allows for digitised data to be seen after the whole conversion (as shown in FIG. 9B). The transient output of the conventional and proposed systems is shown in FIG. 8C. In all of these figures, the proposed system shows no spurs in either the frequency or the time domain. In contrast, the conventional system does display spurs in both the time and frequency domains. Thus the proposed system is advantageous over those conventionally employed.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A circuit for modulating an input signal comprising;
   an offset generator configured to form the input signal by adding an offset to an initial signal;
   a dither signal generator configured to generate a first dither signal having a maximum amplitude;
   a deamplifier configured to reduce the amplitude of said input signal so as to generate a deamplified input signal having a maximum amplitude that is comparable to the maximum amplitude of the dither signal; and
   a summer configured to sum the dither signal with the deamplified input signal.

2. A circuit as claimed in claim 1 wherein the summer is configured to output a summed signal and wherein the circuit further comprises a first modulator configured to modulate the summed signal.

3. A circuit as claimed in claim 2 wherein the first modulator is configured to output a modulated signal, the modulated signal comprising a dither component, and wherein the circuit further comprises a canceller configured to at least partially cancel the dither component from the first modulated signal to form a cancelled signal.

4. A circuit as claimed in claim 3 wherein the circuit comprises an amplifier configured to amplify the cancelled signal.

5. A circuit as claimed in claim 1, wherein the dither signal generator is further configured to generate a second dither signal, the circuit further comprising another summer configured to subtract the second dither signal from the deamplified input signal.

6. A circuit as claimed in claim 5 wherein the summer is configured to output a summed signal and wherein the circuit further comprises a first modulator configured to modulate the summed signal the first modulator is configured to output a modulated signal, the modulated signal comprising a dither component, and wherein the circuit further comprises a canceller configured to at least partially cancel the dither component from the first modulated signal to form a cancelled signal and wherein the circuit further comprises a second modulator configured to receive and modulate a summer signal output by the other summer and to output a modulated signal in dependence thereon.

7. A circuit as claimed in claim 6 wherein the canceller and the amplifier are implemented by an adder configured to add the first and second modulated signals together.

8. A circuit a claimed in claim 6 wherein the first and second modulators are digital modulators.

9. A circuit as claimed in claim 6 wherein the first and second modulators are delta-sigma modulators.

10. A circuit as claimed in claim 5 wherein the first and second dither signals are the same signal.

11. A circuit as claimed in claim 1 wherein the dither signal generator is further configured to generate a second dither signal, the circuit further comprising another summer configured to add the second dither signal to the deamplified input signal.

12. A circuit as claimed in claim 11 wherein the summer is configured to output a summed signal and wherein the circuit further comprises a first modulator configured to modulate the summed signal, the first modulator is configured to output a modulated signal, the modulated signal comprising a dither component, and wherein the circuit further comprises a canceller configured to at least partially cancel the dither component from the first modulated signal to form a cancelled signal and wherein the circuit further comprises a second modulator configured to receive and modulate a summed signal output by the other summer and to output a second modulated signal in dependence thereon.

13. A circuit as claimed in claim 1 wherein the first dither signal has the form r[n] and the second dither signal has the form −r[n].

14. A circuit as claimed in claim 1 wherein the dither signal generator comprises a pseurorandom number generator for generating the dither signals.

15. A circuit as claimed in claim 1 wherein the circuit further comprises an offset-summer configured to effectively subtract the offset from the first modulated signal.

16. A circuit as claimed in claim 1 wherein the first dither signal has an average amplitude of zero.

17. A circuit as claimed in claim 1 wherein the circuit has a maximum noise level associated therewith and the dither signal generator is configured to generate the first dither signal to have a maximum amplitude that is dependent on the maximum noise level.

18. A circuit as claimed in claim 1 wherein the maximum amplitude of the dither signal is at least 80% of the maximum amplitude of the deamplified input signal.

19. A circuit as claimed in claim 1 wherein the maximum amplitude of the dither signal is at least 90% of the maximum amplitude of the deamplified input signal.

20. A circuit as claimed in claim 1 wherein the maximum amplitude of the dither signal is the same as the maximum amplitude of the deamplified input signal.

21. An audio system comprising a circuit as claimed in claim 1.

22. A phase locked loop comprising a circuit as claimed in claim 1.

23. A method for modulating an input signal in a circuit configured to receive an input signal to be modulated, comprising the steps of;
    forming the input signal by adding an offset to an initial signal;
    generating a dither signal having a maximum amplitude;
    reducing the amplitude of said input signal so as to generate a deamplified input signal having a maximum amplitude that is comparable to the maximum amplitude of the dither signal; and
    summing the dither signal with the deamplified input.

24. A circuit for applying a dither signal comprising:
    a first signal path comprising:
        a first input configured to receive an initial signal;
        an offset generator configured to form an input signal by adding an offset to the initial signal;
        a first summer configured to produce a first summed signal by summing a dither signal with the input signal; and
        a first modulator configured to receive and modulate the first summed signal by subtracting the dither signal from the input signal; and
    a second signal path comprising:
        a second input configured to produce a second summed signal by subtracting the dither signal from the input signal; and
        a second modulator configured to receive and modulate the second summed signal so as to output a second modulated signal;
    the circuit further comprising:
        a canceller configured to sum the first and second modulated signals.

* * * * *

UNITED STATES PATENT AND TRADEMARK OFFICE
CERTIFICATE OF CORRECTION

PATENT NO. : 8,730,076 B2
APPLICATION NO. : 13/561507
DATED : May 20, 2014
INVENTOR(S) : Zare-Hoseini et al.

Page 1 of 1

It is certified that error appears in the above-identified patent and that said Letters Patent is hereby corrected as shown below:

In the Specification

Column 8, Line 1, delete "$x_1[n]=x'[n]+r[n]x_1[n]$" and insert -- $x_1[n]$ --, therefor.

In the Claims

Column 10, Line 34, Claim 1, delete "comprising;" and insert -- comprising: --, therefor.

Column 10, Line 65, Claim 6, delete "signal the" and insert -- signal, the --, therefor.

Column 11, Line 10, Claim 8, delete "circuit a" and insert -- circuit as --, therefor.

Column 11, Line 33, Claim 13, delete "claim 1" and insert -- claim 11 --, therefor.

Column 12, Line 17, Claim 23, delete "steps of;" and insert -- steps of: --, therefor.

Signed and Sealed this
Twenty-third Day of September, 2014

Michelle K. Lee
*Deputy Director of the United States Patent and Trademark Office*